United States Patent
Jin et al.

(10) Patent No.: US 10,134,782 B2
(45) Date of Patent: Nov. 20, 2018

(54) THIN-FILM TRANSISTOR ARRAY SUBSTRATE, METHOD OF MANUFACTURING THE SAME, AND DISPLAY DEVICE

(71) Applicant: SAMSUNG DISPLAY CO., LTD., Yongin, Gyeonggi-Do (KR)

(72) Inventors: Guanghai Jin, Yongin (KR); Yongjoo Kim, Yongin (KR); Minhyeng Lee, Yongin (KR)

(73) Assignee: SAMSUNG DISPLAY CO., LTD., Yongin, Gyeonggi-do (KR)

( * ) Notice: Subject to any disclaimer, the term of this patent is extended or adjusted under 35 U.S.C. 154(b) by 0 days.

(21) Appl. No.: 14/819,611

(22) Filed: Aug. 6, 2015

(65) Prior Publication Data

US 2016/0079286 A1    Mar. 17, 2016

(30) Foreign Application Priority Data

Sep. 15, 2014    (KR) .................. 10-2014-0122043

(51) Int. Cl.
*H01L 27/12* (2006.01)
*H01L 29/49* (2006.01)
(Continued)

(52) U.S. Cl.
CPC ........ *H01L 27/1255* (2013.01); *H01L 21/283* (2013.01); *H01L 21/28026* (2013.01);
(Continued)

(58) Field of Classification Search
CPC .............. H01L 27/1255; H01L 27/124; H01L 21/28026; H01L 27/127; H01L 21/283;
(Continued)

(56) References Cited

U.S. PATENT DOCUMENTS 5,583,369 A     12/1996  Yamazaki et al.
8,877,619 B1 *  11/2014  Thompson ...... H01L 21/823807
                                                    438/308
(Continued)

FOREIGN PATENT DOCUMENTS

KR    10-2005-0121601 A    12/2005
KR    10-0796609 B1         1/2008
(Continued)

OTHER PUBLICATIONS

Extended European Search Report dated Feb. 16, 2016 in Corresponding European Patent Application No. 15185185.4

*Primary Examiner* — Marc Armand
*Assistant Examiner* — Sue Tang
(74) *Attorney, Agent, or Firm* — Lee & Morse P.C.

(57) ABSTRACT

A thin-film transistor (TFT) array substrate including at least one TFT, the at least one TFT including a semiconductor layer including a source region and a drain region having a first doping concentration on a substrate, a channel region between the source and drain regions and having a second doping concentration, the second doping concentration being lower than the first doping concentration, and a non-doping region extending from the source and drain regions; a gate insulating layer on the semiconductor layer; a gate electrode on the gate insulating layer and at least partially overlapping the channel region; and a source electrode and a drain electrode insulated from the gate electrode and electrically connected to the source region and the drain region, respectively.

19 Claims, 8 Drawing Sheets

(51) Int. Cl.
  *H01L 29/66* (2006.01)
  *H01L 21/28* (2006.01)
  *H01L 21/283* (2006.01)
  *H01L 29/417* (2006.01)
  *H01L 29/423* (2006.01)
  *H01L 29/786* (2006.01)

(52) U.S. Cl.
  CPC .......... *H01L 27/124* (2013.01); *H01L 27/127* (2013.01); *H01L 27/1222* (2013.01); *H01L 27/1288* (2013.01); *H01L 29/41733* (2013.01); *H01L 29/42384* (2013.01); *H01L 29/4908* (2013.01); *H01L 29/66545* (2013.01); *H01L 29/66742* (2013.01); *H01L 29/78696* (2013.01); *H01L 2227/323* (2013.01)

(58) Field of Classification Search
  CPC ......... H01L 29/66742; H01L 29/78696; H01L 29/42384; H01L 29/41733
  See application file for complete search history.

(56) References Cited

U.S. PATENT DOCUMENTS

| | | | |
|---|---|---|---|
| 8,895,999 | B2 | 11/2014 | Jin et al. |
| 2006/0081849 | A1* | 4/2006 | Lee .................. H01L 27/283 257/72 |
| 2007/0284585 | A1* | 12/2007 | Cho .................. H01L 27/3262 257/72 |
| 2008/0044958 | A1 | 2/2008 | Hwang |
| 2008/0093602 | A1 | 4/2008 | Matsumura et al. |
| 2008/0258196 | A1* | 10/2008 | Chen ................ G02F 1/136213 257/296 |
| 2011/0133095 | A1* | 6/2011 | Imai .................. G01T 1/2018 250/370.08 |
| 2011/0266544 | A1* | 11/2011 | Park ................ H01L 27/3248 257/59 |
| 2011/0266546 | A1 | 11/2011 | You |
| 2012/0080663 | A1 | 4/2012 | Lee et al. |
| 2013/0037814 | A1* | 2/2013 | Oh .................. H01L 21/28008 257/59 |
| 2013/0134423 | A1* | 5/2013 | Jin .................. H01L 27/326 257/59 |
| 2013/0299784 | A1* | 11/2013 | Jin .................. H01L 51/56 257/40 |
| 2014/0246675 | A1* | 9/2014 | Imamura ............ H01L 29/7869 257/43 |
| 2016/0064425 | A1* | 3/2016 | Kim .................. H01L 27/1255 438/151 |

FOREIGN PATENT DOCUMENTS

| | | |
|---|---|---|
| KR | 10-2012-0035419 A | 4/2012 |
| KR | 10-2013-0125240 A | 11/2013 |

* cited by examiner

THIN-FILM TRANSISTOR ARRAY SUBSTRATE, METHOD OF MANUFACTURING THE SAME, AND DISPLAY DEVICE

CROSS-REFERENCE TO RELATED APPLICATION

Korean Patent Application No. 10-2014-0122043, filed on Sep. 15, 2014, in the Korean Intellectual Property Office, and entitled: "Thin-Film Transistor Array Substrate, Method of Manufacturing the Same, and Display Device," is incorporated by reference herein in its entirety.

BACKGROUND

1. Field

One or more exemplary embodiments relate to a thin-film transistor (TFT) array substrate, a method of manufacturing the same, and a display device employing the TFT array substrate.

2. Description of the Related Art

A flat panel display apparatus, such as an organic light-emitting display apparatus or a liquid crystal display apparatus, may include a thin-film transistor (TFT), a capacitor, and a wire connecting the TFT and the capacitor.

SUMMARY

Embodiments may be realized by providing a thin-film transistor (TFT) array substrate including at least one TFT, the at least one TFT including a semiconductor layer including a source region and a drain region having a first doping concentration on a substrate, a channel region between the source and drain regions and having a second doping concentration, the second doping concentration being lower than the first doping concentration, and a non-doping region extending from the source and drain regions; a gate insulating layer on the semiconductor layer; a gate electrode on the gate insulating layer and at least partially overlapping the channel region; and a source electrode and a drain electrode insulated from the gate electrode and electrically connected to the source region and the drain region, respectively.

The TFT array substrate may further include a capacitor including a lower electrode on the semiconductor layer where the non-doping region extends; and an upper electrode insulated from the lower electrode and at least partially overlapping the lower electrode.

A thickness of the gate electrode may be thinner than a thickness of the lower electrode.

The lower electrode may include a first electrode layer and a second electrode layer, and the first electrode layer may be formed of a same material as the gate electrode.

A thickness of the first electrode layer may be thinner than a thickness of the second electrode layer, and a thickness of the gate electrode may be the same as the thickness of the first electrode layer.

The upper electrode may include a same material as the source or drain electrode.

The gate electrode may include a transparent conductive material.

A thickness of the gate electrode may be from about 300 Å to about 500 Å.

The TFT array substrate may further include a planarization film that covers the TFT and includes an opening partially exposing the source or drain electrode.

The TFT array substrate may further include a pad electrode that includes a same material as the source and drain electrodes and is electrically connected to the TFT to transmit a current to the TFT.

Embodiments may be realized by providing a display apparatus, including the presently disclosed thin-film transistor (TFT) array substrate; a pixel electrode electrically connected to the source and drain electrodes; and a counter electrode facing the pixel electrode. An intermediate layer may be between the pixel electrode and the counter electrode, and may include an organic emission layer or a liquid crystal layer.

Embodiments may be realized by providing a method of manufacturing a thin-film transistor (TFT) array substrate, the method including forming a non-doping semiconductor layer on an entire surface of a substrate; forming a gate insulating layer on the non-doping semiconductor layer; forming a preliminary-gate electrode of a TFT and a lower electrode of a capacitor on the gate insulating layer; forming an interlayer insulating layer covering the lower electrode and having an opening exposing portions that are to become a channel region and a source-drain region of the TFT; performing a first doping process by forming the source-drain region in the non-doping semiconductor layer; forming a source electrode and a drain electrode, which are connected to the source-drain region, and an upper electrode overlapping the lower electrode; and performing a second doping process by forming the channel region on the non-doping semiconductor layer.

Performing the first doping process may include injecting a dopant using the preliminary-gate electrode and the interlayer insulating layer as masks.

The preliminary-gate electrode may include a gate electrode and an upper gate electrode on the gate electrode, the method may further include, before performing the second doping process, removing the upper gate electrode, and the second doping process may include injecting a dopant using the source electrode and the drain electrode as masks.

The dopant injected during the second doping process may be doped on the non-doping semiconductor layer through the gate electrode.

The upper gate electrode may include a same material as the source electrode and the drain electrode, and removing the upper gate electrode may be performed simultaneously with forming the source electrode and the drain electrode.

The gate electrode may include a transparent conductive material, and a thickness of the gate electrode may be from about 300 Å to about 500 Å.

A doping concentration of the source-drain region may be higher than a doping concentration of the channel region.

The gate insulating layer may include a contact hole exposing a part of the source-drain region, and the contact hole may be formed simultaneously with the opening of the interlayer insulating layer during a halftone mask process.

The method may further include forming a planarization film that covers the source electrode, the drain electrode, and the upper electrode, and includes an opening exposing a part of the source or drain electrode.

BRIEF DESCRIPTION OF THE DRAWINGS

Features will become apparent to those of skill in the art by describing in detail exemplary embodiments with reference to the attached drawings in which.

DETAILED DESCRIPTION

Example embodiments will now be described more fully hereinafter with reference to the accompanying drawings; however, they may be embodied in different forms and should not be construed as limited to the embodiments set forth herein. Rather, these embodiments are provided so that this disclosure will be thorough and complete, and will fully convey exemplary implementations to those skilled in the art.

In drawings, like reference numerals refer to like elements throughout and overlapping descriptions shall not be repeated.

It will be understood that although the terms "first", "second", etc., may be used herein to describe various components, these components should not be limited by these terms. These components are only used to distinguish one component from another.

As used herein, the singular forms "a," "an", and "the" are intended to include the plural forms as well, unless the context clearly indicates otherwise.

It will be further understood that the terms "comprises" and/or "comprising" used herein specify the presence of stated features or components, but do not preclude the presence or addition of one or more other features or components.

It will be understood that when a layer, region, or component is referred to as being "formed on," another layer, region, or component, it can be directly or indirectly formed on the other layer, region, or component. That is, for example, intervening layers, regions, or components may be present. Further, it will be understood that when a layer is referred to as being "under" another layer, it can be directly under, and one or more intervening layers may also be present. In addition, it will also be understood that when a layer is referred to as being "between" two layers, it can be the only layer between the two layers, or one or more intervening layers may also be present.

Sizes of elements, e.g., dimensions of layers and regions, in the drawings may be exaggerated for convenience of explanation. In other words, since sizes and thicknesses of components in the drawings are arbitrarily illustrated for convenience of explanation, the following embodiments are not limited thereto.

When a certain embodiment may be implemented differently, a specific process order may be performed differently from the described order. For example, two consecutively described processes may be performed substantially at the same time or performed in an order opposite to the described order.

As used herein, the term "and/or" includes any and all combinations of one or more of the associated listed items.

Figure 1:
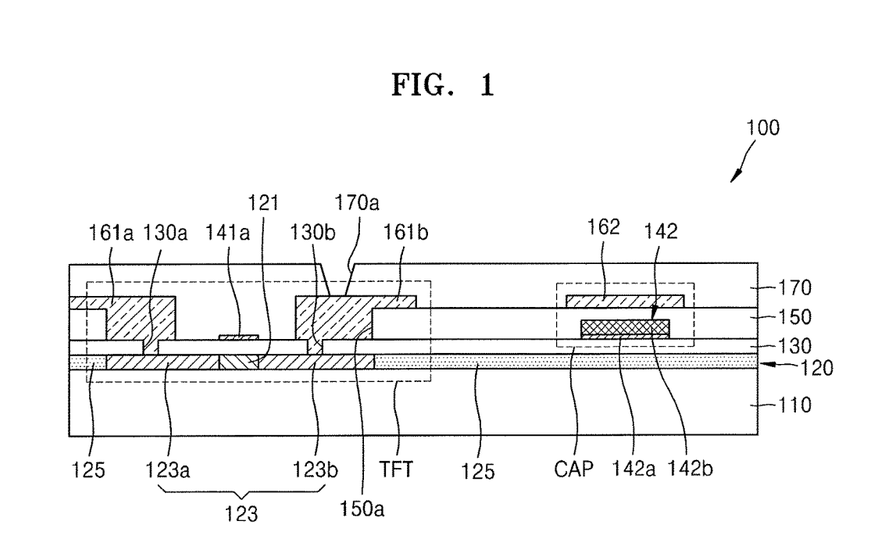
FIG. 1 illustrates a cross-sectional view of a thin-film transistor (TFT) array substrate according to an exemplary embodiment.

FIG. 1 illustrates a cross-sectional view of a thin-film transistor (TFT) array substrate 100 according to an exemplary embodiment.

The TFT array substrate 100 may include a plurality of TFTs that are regularly arranged or irregularly arranged, or may include only one TFT.

Referring to FIG. 1, the TFT array substrate 100 may include at least one TFT, wherein the TFT includes a semiconductor layer 120, a gate insulating layer 130, a gate electrode 141a, a source electrode 161a, and a drain electrode 161b.

The semiconductor layer 120 may include a source region 123a and a drain region 123b, which have a first doping concentration, a channel region 121 disposed between the source and drain regions 123a and 12b and having a second doping concentration, and a non-doping region 125 extending from the source and drain regions 123a and 123b. The second doping concentration may be lower than the first doping concentration. In some embodiments, the second doping concentration may be lower than the first doping concentration by $10^2$ to $10^4$ times. In some embodiments, the second doping concentration may be from about $1E12/cm^3$ to about $5E12/cm^3$, and the first doping concentration may be from about $1E15/cm^3$ to about $5E15/cm^3$.

The channel region 121 may be doped to adjust a threshold voltage of the TFT, and the conductivities of the channel region 121 and a source-drain region 123 may be the same or different from each other. For example, the source-drain region 123 may be a p-type semiconductor, and the channel region 121 may be an n-type semiconductor. In an embodiment, the source-drain region 123 and the channel region 121 may have the same conductivities but different doping concentrations.

The TFT array substrate 100 may further include a capacitor CAP including a lower electrode 142 formed on the same layer as the gate electrode 141a, and an upper electrode 162 insulated from the lower electrode 142.

The TFT array substrate 100 may further include an interlayer insulating film 150 and/or a planarization film 170.

A substrate 110 may be formed of a glass material, a plastic material, or a metal material. The substrate 110 may be a flexible substrate. A buffer layer (not shown) may be formed on the substrate 110. The buffer layer may provide a flat surface on the substrate 110, and may contain an insulating material, and external moisture and external impurities may be blocked from penetrating through the substrate 110. In an embodiment, the buffer layer may not be included.

The TFT may be provided on the substrate 110. The TFT may include the semiconductor layer 120, the gate electrode 141a, the source electrode 161a, and the drain electrode 161b.

The semiconductor layer 120 may be formed of a semiconductor including amorphous silicon or crystalline silicon, and may include the source and drain regions 123a and 123b, which have the first doping concentration, and the channel region 121 disposed between the source and drain electrodes 123a and 123b and having the second doping concentration. Hereinafter, the source and drain regions 123a and 123b may be commonly referred to as the source-drain region 123. The source-drain region 123 includes the source and drain regions 123a and 123b. The source-drain region 123 and the channel region 121 may have conductivities based on whether a dopant is added. For example, if a trivalent dopant, such as boron (B) is added, a p-type conductivity may be shown, and if a pentavalent dopant, such as phosphor (P), arsenic (As), or antimony (Sb), is added, an n-type conductivity may be shown.

The semiconductor layer 120 may include the non-doping region 125 extending from the source-drain region 123. The non-doping region 125 is a region that is not doped, and may surround the channel region 121 and the source-drain region 123. The non-doping region 125 may be insulating, and the TFT may be electrically isolated from other adjacent components. The interlayer insulating film 150 may be correspondingly disposed above the non-doping region 125.

The semiconductor layer 120 may be formed on an entire surface of the substrate 110, and may not be patterned via a separate mask process. Accordingly, a number of masks may be reduced, and reduced costs and simplified manufacturing processes may be realized.

The gate electrode 141a may be disposed on the semiconductor layer 120 at a location corresponding to the channel region 121 of the semiconductor layer 120, wherein the gate insulating layer 130 is disposed between the semiconductor layer 120 and the gate electrode 141a.

The gate insulating layer 130 may be disposed on the semiconductor layer 120, and may include a first contact hole 130a and a second contact hole 130b that expose the source region 123a and the drain region 123b, respectively. The gate insulating layer 130 may include an insulating material, and the semiconductor layer 120 and the gate electrode 141a may be electrically separated from each other. In some embodiments, the gate insulating layer 130 may have a single layer or a stacked structure of an inorganic material and an organic material. In some embodiments, the gate insulating layer 130 may include silicon nitride ($SiN_x$) and/or silicon oxide ($SiO_x$).

The gate electrode 141a may be formed of a material and may have a thickness such that a dopant for doping the channel region 121 may penetrate therethrough. In some embodiments, the gate electrode 141a may be formed of a transparent conductive material. For example, the gate electrode 141a may be formed of indium tin oxide (ITO), indium zinc oxide (IZO), zinc oxide (ZnO), or indium oxide ($In_2O_3$).

The gate electrode 141a may be formed on the same layer as the lower electrode 142 of the capacitor CAP. A thickness of the gate electrode 141a may be thinner than a thickness of the lower electrode 142. In some embodiments, the thickness of the gate electrode 141a may be from about 300 Å to about 500 Å. In an embodiment, the thickness of the gate electrode 141a may be determined based on concentration and an injection speed of a dopant doped on the channel region 121.

The source and drain electrodes 161a and 161b may be spaced apart from the gate electrode 141a, on the gate insulating layer 130. The interlayer insulating film 150 may be further disposed between the source and drain electrode 161a and 161b and the gate insulating layer 130. The source electrode 161a may be connected to the source region 123a through the first contact hole 130a of the gate insulating layer 130. The drain electrode 161b may be connected to the drain region 123b through the second contact hole 130b of the gate insulating layer 130.

The source and drain electrodes 161a and 161b may be simultaneously formed using the same material. The source electrode 161a and/or the drain electrode 161b may be simultaneously formed with the same material as the upper electrode 162 of the capacitor CAP. The source and drain electrodes 161a and 161b may include aluminum (Al), molybdenum (Mo), titanium (Ti), or copper (Cu). In some embodiments, the source electrode 161a and the drain electrode 161b may have a stacked structure of Ti/Cu, Mo/Al/Mo, Mo/AlGe/Mo, or Ti/Al/Ti. In some embodiments, thicknesses of the source and drain electrodes 161a and 161b may each be at least 1000 Å.

The capacitor CAP may include the lower electrode 142 that is disposed on the semiconductor layer 120 where the non-doping region 125 of the TFT extends, and the upper electrode 162 that is insulated from the lower electrode 142 and at least partially overlaps the lower electrode 142.

The lower electrode 142 may be formed on the same layer as the gate electrode 141a, and may be thicker than the gate electrode 141a. In some embodiments, the lower electrode 142 may include a first electrode layer 142a and a second electrode layer 142b. The first electrode layer 142a may be simultaneously formed of the same material as the gate electrode 141a. The first electrode layer 142 may have substantially the same thickness as the gate electrode 141a. The first electrode layer 142a may be formed of a transparent conductive material. For example, the first electrode layer 142a may be formed of ITO, IZO, ZnO, or $In_2O_3$.

The second electrode layer 142b may be thicker than the first electrode layer 142a. The second electrode layer 142b may be formed of the same material as the source or drain electrode 161a or 161b. The second electrode layer 142b may include Al, Mo, Ti, or Cu. In some embodiments, the second electrode layer 142b may have a stacked structure of Ti/Cu, Mo/Al/Mo, Mo/AlGe/Mo, or Ti/Al/Ti.

The upper electrode 162 may be insulated from the lower electrode 142 by the interlayer insulating film 150, and the upper electrode 162 may be disposed to at least partially overlap the lower electrode 142. The upper electrode 162 may be formed of the same material as the source or drain electrode 161a or 161b. The upper electrode 162 may include Al, Mo, Ti, or Cu. In some embodiments, the upper electrode 162 may have a stacked structure of Ti/Cu, Mo/Al/Mo, Mo/AlGe/Mo, or Ti/Al/Ti.

The interlayer insulating film 150 may be disposed between the lower electrode 142 and the upper electrode 162, and may operate as a dielectric material for determining capacity of the capacitor CAP. The interlayer insulating film 150 may be formed of any one of various insulating materials. For example, the interlayer insulating film 150 may be formed of an inorganic material, such as oxide or nitride, or an organic material. In some embodiments, the interlayer insulating film 150 may have a single layer or a stacked structure of an organic material and an inorganic material. The interlayer insulating film 150 may be correspondingly formed to the non-doping region 125 of the semiconductor layer 120. The interlayer insulating film 150 may operate as a mask that prevents a dopant from being injected to the non-doping region 125 during a first doping process and a second doping process to be described later.

The planarization film 170 may be disposed on the TFT and/or the capacitor CAP. The planarization film 170 may be formed of an insulating material, and may have a single layer or multilayer of an inorganic material, an organic material, or an inorganic/organic compound. In some embodiments, the planarization film 170 may be formed of an organic material. When the planarization film 170 is formed of an organic material, the planarization film 170 may be thicker than when it is formed of an inorganic material, and parasitic capacitance may be prevented. In some embodiments, the planarization film 170 may have a thickness from about 3 μm to about 5 μm and have an even surface as a material, such as polyacrylate, polyimides, or benzocyclobutene (BCB), is coated thereon. The planarization film 170 may include a first opening 170a that exposes a part of the source or drain electrode 161a or 161b. The TFT may be electrically connected to another device or a wire through the first opening 170a.

Figure 2:
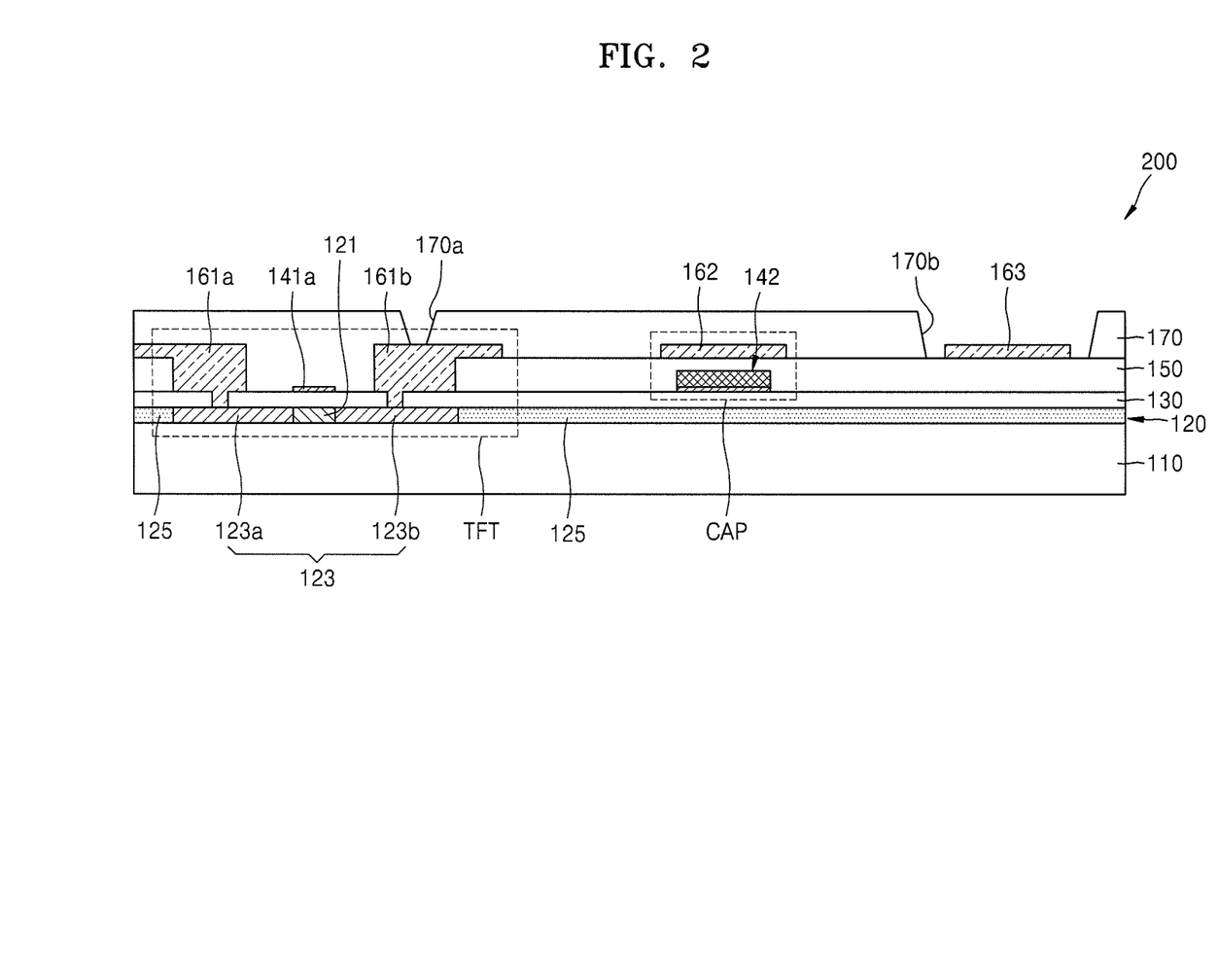
FIG. 2 illustrates a cross-sectional view of a TFT array substrate according to an exemplary embodiment.

FIG. 2 illustrates a cross-sectional view of a TFT array substrate 200 according to an exemplary embodiment. In FIGS. 1 and 2, like reference numerals denote like elements, and overlapping details are not provided. Referring to FIG. 2, the TFT array substrate 200 may include at least one TFT, wherein the TFT includes the semiconductor layer 120, the gate insulating layer 130, the gate electrode 141a, the source electrode 161a, and the drain electrode 161b.

The semiconductor layer 120 may include the source and drain electrodes 123a and 123b, which have the first doping concentration, the channel region 121 disposed between the source and drain regions 123a and 123b, and the non-doping region 125 extending from the source and drain regions 123a and 123b. At least one of doping concentrations and doping types of the channel region 121 and the source and drain regions 123a and 123b may be different from each other. The second doping concentration may be different from the first doping concentration, and the channel region 121 and the source-drain region 123 may have different conductivities. For example, the source-drain region 123 may be a p-type semiconductor and the channel region 121 may be an n-type semiconductor. In an embodiment, the source-drain region 123 and the channel region 121 may have the same conductivities but different doping concentrations.

In some embodiments, the second doping concentration may be lower than the first doping concentration. In some embodiments, the second doping concentration may be lower than the first doping concentration by $10^2$ to $10^4$ times. In some embodiments, the second doping concentration may be from about $1E12/cm^3$ to about $5E12/cm^3$, and the first doping concentration may be from about $1E15/cm^3$ to about $5E15/cm^3$.

The TFT array substrate 200 may further include the capacitor CAP including the lower electrode 142 formed on the same layer as the gate electrode 141a and the upper electrode 162 insulated from the lower electrode 142.

The TFT array substrate 100 may further include the interlayer insulating film 150 and/or the planarization film 170.

The TFT array substrate 200 may further include a pad electrode 163 that may be electrically connected to the TFT to transmit a current to the TFT.

The pad electrode 163 may be electrically connected to a driver integrated circuit (IC) (not shown) that supplies a current for driving the TFT, and the pad electrode 163 may receive and transmit the current from the driver IC to the TFT. The pad electrode 163 may be electrically connected to the TFT.

The pad electrode 163 may be disposed on the interlayer insulating film 150. The pad electrode 163 may be formed of the same material as the source or drain electrode 161a or 161b of the TFT via the same process. The pad electrode 163 may include Al, Mo, Ti, or Cu. In some embodiments, the pad electrode 163 may have a stacked structure of Ti/Cu, Mo/Al/Mo, Mo/AlGe/Mo, or Ti/Al/Ti.

The planarization film 170 may include a second opening 170b, and the pad electrode 163 may be externally exposed.

Figure 3A:
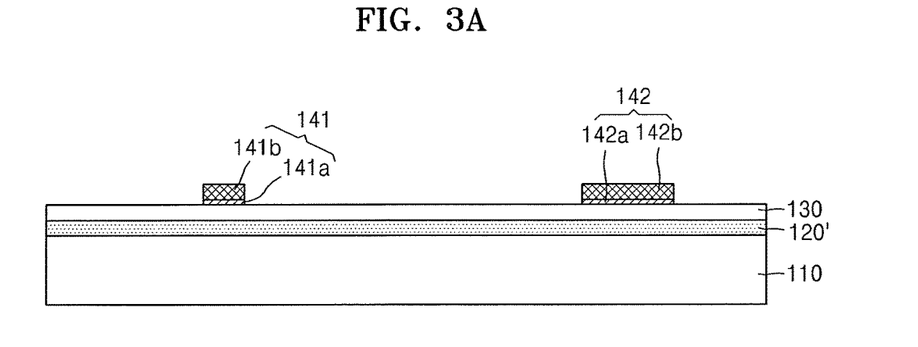
FIGS. 3A through 3F illustrate cross-sectional views for describing a method of manufacturing a TFT array substrate, according to an exemplary embodiment.

FIGS. 3A through 3E illustrate cross-sectional views for describing a method of manufacturing a TFT array substrate, according to an exemplary embodiment. In the current embodiment, the TFT array 100 of FIG. 1 is manufactured using the method. Referring to FIG. 3A, a non-doping semiconductor layer 120', the gate insulating layer 130, and a first conductive film (not shown) may be continuously formed on the substrate 110, and then the first conductive film may be patterned to form a preliminary-gate electrode 141 and the lower electrode 142 of the capacitor CAP.

First, the non-doping semiconductor layer 120' may be entirely deposited on the substrate 110. The non-doping semiconductor layer 120' may be a semiconductor layer on which artificial doping is not performed, and may be a layer formed of a semiconductor having an insulating property. The non-doping semiconductor layer 120' may be formed of a semiconductor including amorphous silicon or crystalline silicon, and may be deposited via any one of various deposition methods. Crystalline silicon may be formed by crystallizing amorphous silicon. Examples of a method of crystallizing amorphous silicon include a rapid thermal annealing (RTA) method, a solid phase crystallization (SPC) method, an excimer laser annealing (ELA) method, a metal induced crystallization (MIC) method, a metal induced lateral crystallization (MILC) method, and a sequential lateral solidification (SLS) method.

A buffer layer (not shown) may be disposed between the substrate 110 and the non-doping semiconductor layer 120'. The buffer layer may be formed of an insulating material, and may be deposited via any one of various deposition methods. In an embodiment, the buffer layer may be omitted.

According to exemplary embodiments, a separate patterning process using a mask may not be performed on the non-doping semiconductor layer 120', a number of masks may be reduced, and manufacturing costs and time may be reduced.

The gate insulating layer 130 may be formed on the non-doping semiconductor layer 120'. The gate insulating layer 130 may be formed of an organic or inorganic insulating material. In some embodiments, the gate insulating layer 130 may be formed of $SiN_x$, $SiO_2$, hafnium (Hf) oxide, or Al oxide. The gate insulating layer 130 may be formed via any one of various deposition methods, such as a sputtering method, a chemical vapor deposition (CVD) method, and a plasma enhanced chemical vapor deposition (PECVD) method.

Then, the first conductive film may be entirely formed on the gate insulating layer 130, and the preliminary-gate electrode 141 and the lower electrode 142 may be patterned via a first mask process.

The first conductive film may be formed via any one of various deposition methods, such as a sputtering method, a CVD method, or a PECVD method.

The first mask process may be performed by coating a photoresist, selectively exposing the photoresist to light using a first mask, and then performing a series of processes, such as a developing process, an etching process, and a stripping or ashing process. The etching process may include a wet etching process, a dry etching process, or a combination thereof.

The preliminary-gate electrode 141 may include the gate electrode 141a and an upper gate electrode 141b formed on the gate electrode 141a. The upper gate electrode 141b may be thicker than the gate electrode 141a, and the upper gate electrode 141b may be used as a mask during the first doping process that will be described later. The upper gate electrode 141b may be formed of the same material as the source or drain electrode 161a or 161b. The upper gate electrode 141b may include Al, Mo, Ti, or Cu. In some embodiments, the upper gate electrode 141b may have a stacked structure of Ti/Cu, Mo/Al/Mo, or Ti/Al/Ti.

The lower electrode 142 may have the same structure as the preliminary-gate electrode 141. The lower electrode 142 may include the first electrode layer 142a and the second electrode layer 142b. The first electrode layer 142a may be formed of the same material as the gate electrode 141a, and the second electrode layer 142b may be formed of the same material as the upper gate electrode 141b.

Figure 3B:
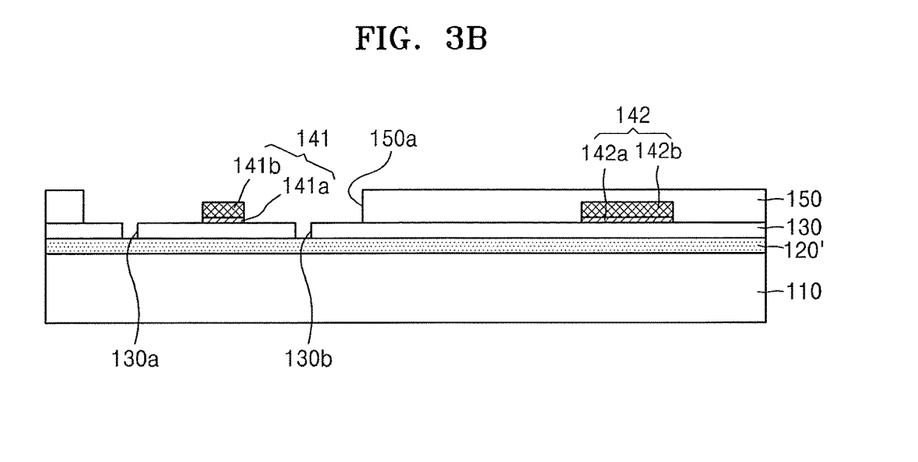

Referring to FIG. 3B, a first insulating film (not shown) may be formed to cover the preliminary-gate electrode 141 and the lower electrode 142, and then an opening 150a may be formed by removing a region where the TFT is to be formed. Accordingly, the interlayer insulating film 150 may include the opening 150a in the region where the TFT is to be formed, and the first and second contact holes 130a and 130b may be formed in the gate insulating layer 130.

The first insulating film may have a single layer or stacked structure of an organic insulating material and an inorganic insulating material. In some embodiments, the first insulating film may be formed of SiNx, SiO$_2$, Hf oxide, or Al oxide. The first insulating film may be formed via any one of various deposition methods, such as a sputtering method, a CVD method, and a PECVD method.

Then, the first insulating film may be removed based on the preliminary-gate electrode 141 to form the interlayer insulating film 150 including the opening 150a, via a second mask process. During the second mask process, the opening 150a may be formed and at the same time, the first and second contact holes 130a and 130b of the gate insulating layer 130 may be simultaneously formed using a halftone mask. Parts of the non-doping semiconductor layer 120' may be exposed by the first and second contact holes 130a and 130b.

Figure 3C:
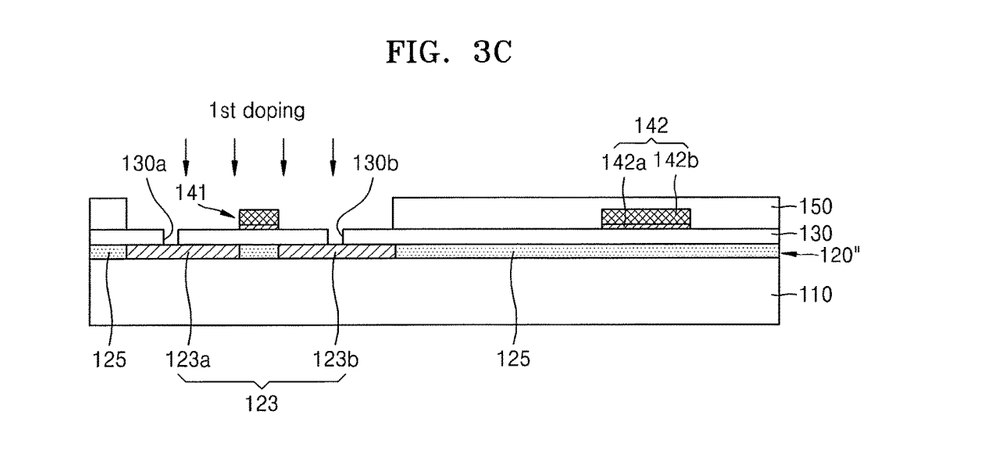

Then, referring to FIG. 3C, the first doping process may be performed to form the source-drain region 123 in the non-doping semiconductor layer 120'. By performing the doping process, a preliminary-semiconductor layer 120" including the source-drain region 123 and the non-doping region 125 and having the first doping concentration may be formed. During the first doping process, the source-drain region 123 may be formed by partially injecting p- or n-type dopant ions to the non-doping semiconductor layer 120'.

During the first doping process, the preliminary-gate electrode 141 and the interlayer insulating film 150 may operate as masks. A separate mask may not be required to form the source-drain region 123, and the non-doping region 125 having an insulating property may be maintained by the interlayer insulating film 150.

The gate insulating layer 130 may be formed of a material and have a thickness such that a dopant injected during the first doping process may penetrate therethrough, and the dopant may be injected to the source-drain region 123 through the gate insulating layer 130.

Figure 3D:
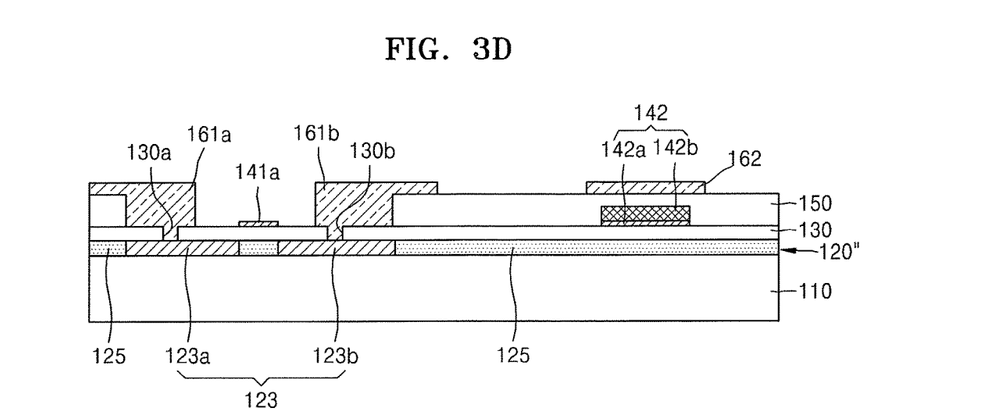

Referring to FIG. 3D, the source electrode 161a, the drain electrode 161b, and the upper electrode 162 of the capacitor CAP may be formed.

First, in order to form the source electrode 161a, the drain electrode 161b, and the upper electrode 162 of the capacitor CAP, a second conductive film (not shown) may be entirely formed on the substrate 110 to cover the preliminary-gate electrode 141 and the interlayer insulating film 150, and a third mask process may be performed.

The second conductive film may be formed via any one of various deposition methods, such as a sputtering method, a CVD method, and a PECVD method.

The second conductive film may include Al, Mo, Ti, or Cu. In some embodiments, the second conductive film may have a stacked structure of Ti/Cu, Mo/Al/Mo, Mo/AlGe/Mo, or Ti/Al/Ti. In some embodiments, a thickness of the second conductive film may be at least 1000 Å. In some embodiments, the second conductive film may be formed of the same material as the upper gate electrode 141b of FIG. 3C. The upper gate electrode 141b may have the same etch rate as the second conductive film, and the upper gate electrode 141b may be removed while the source electrode 161a, the drain electrode 161b, and the upper electrode 162 of the capacitor CAP are patterned during the third mask process.

The third mask process may be performed by coating a photoresist, selectively exposing the photoresist to light using a third mask, and then performing a series of processes, such as a developing process, an etching process, and a stripping or ashing process. The etching process may include a wet etching process, a dry etching process, or a combination thereof.

As described above, during the third mask process, the source electrode 161a, the drain electrode 161b, and the upper electrode 162 of the capacitor CAP may be formed, and the upper gate electrode 141b may be removed from the preliminary-gate electrode 141. In an embodiment, a process of removing the upper gate electrode 141b may be performed via a separate mask process or an etch-back process.

Figure 3E:
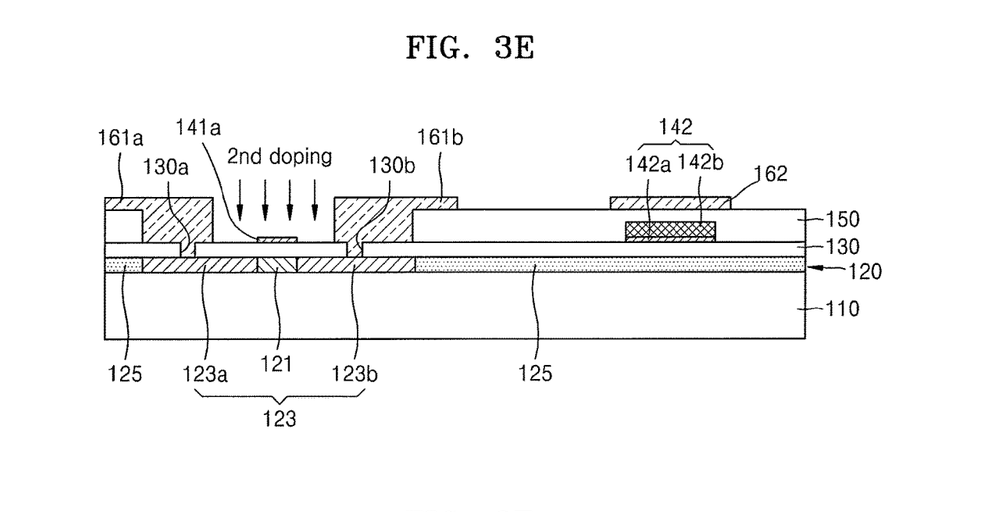
Figure 3F:
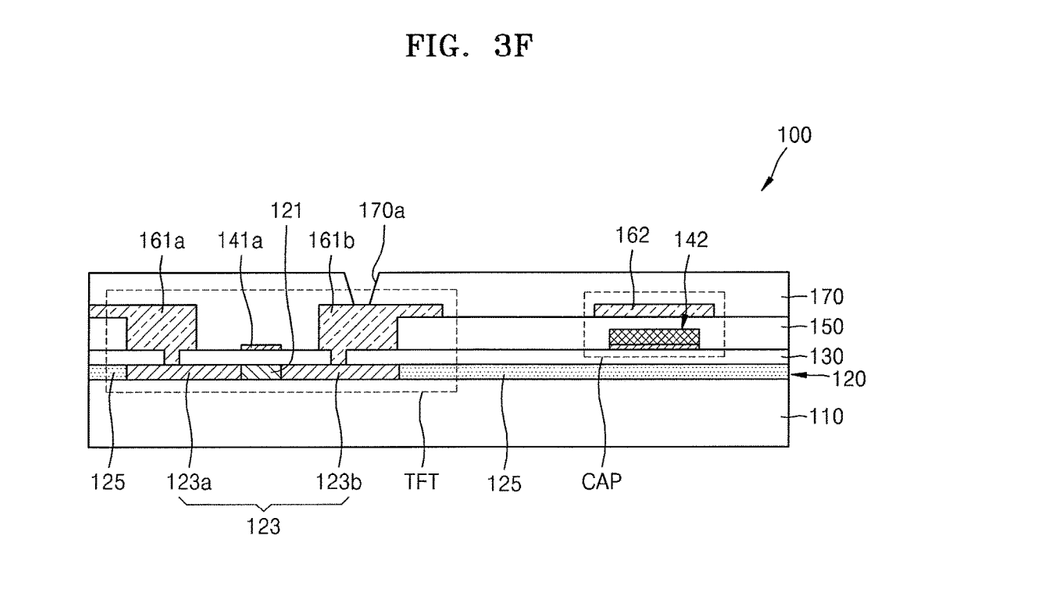

Referring to FIG. 3E, channel doping may be performed via the second doping process. During the second doping process, the source electrode 161a, the drain electrode 161b, and the interlayer insulating film 150 may operate as masks. The gate electrode 141a may have a thickness through which a dopant may penetrate, and the dopant may penetrate through the preliminary-semiconductor layer 120" and form the channel region 121 during the second doping process.

The channel region 121 has the second doping concentration, the second doping concentration may be sufficiently lower than the first doping concentration that is a doping concentration of the source-drain region 123, and the second doping process may barely affect the doping concentration of the source-drain region 123.

The second doping concentration may be lower than the first doping concentration by about $10^2$ to $10^4$ times.

The channel region 121 may be doped to adjust a threshold voltage of the TFT, and a first doping type and a second doping type may be the same or different from each other.

The channel region 121 may be formed via the second doping process, and the semiconductor layer 120 including the channel region 121 having the second doping concentration, the source-drain region 123 having the first doping concentration, and the non-doping region 125 may be formed.

Referring to FIG. 2, the planarization film 170 covering the TFT and the capacitor CAP may be formed.

The planarization film 170 may include an insulating material, and may have a single layer or multilayer structure of an inorganic material, an organic material, or inorganic/organic materials.

In some embodiments, the planarization film 170 may be formed of an organic material. When the planarization film 170 is formed of an organic material, the planarization film 170 may be thicker than when it is formed of an inorganic material, and parasitic capacitance may be prevented. In some embodiments, the planarization film 170 may have a thickness from about 3 μm to about 5 μm and have an even surface as a material, such as polyacrylate, polyimides, or BCB, is coated thereon. The planarization film 170 may include the first opening 170a that exposes a part of the source or drain electrode 161a or 161b. The TFT may be electrically connected to another device or a wire through the first opening 170a.

Figure 4:
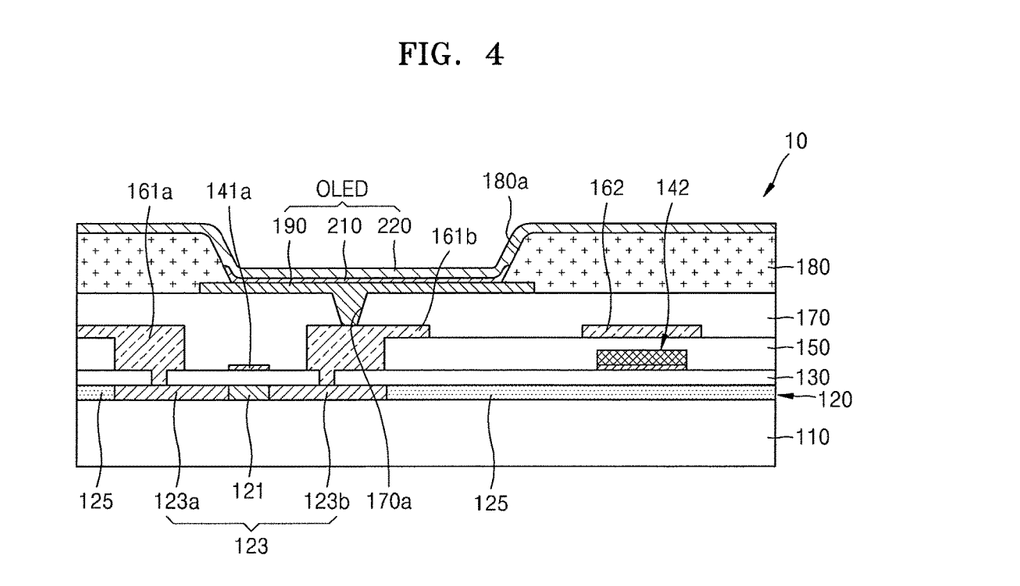
FIGS. 4 through 6 illustrate cross-sectional views of display apparatuses to which a TFT array substrate is applied, according to exemplary embodiments.
Figure 5:
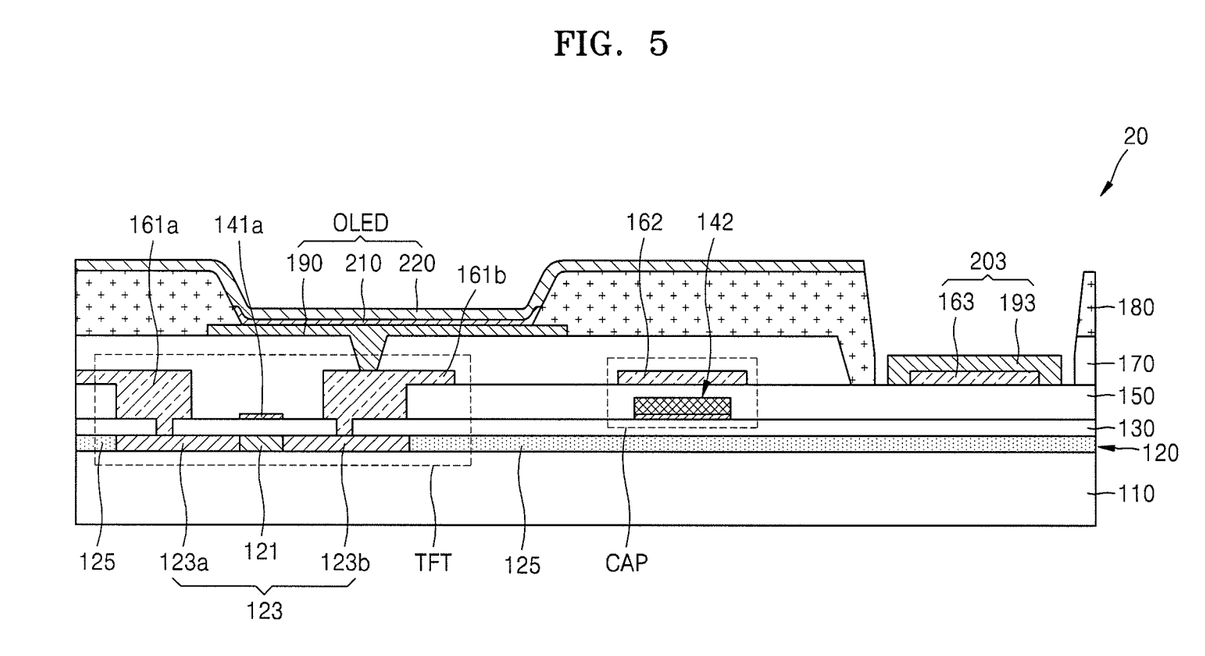
Figure 6:
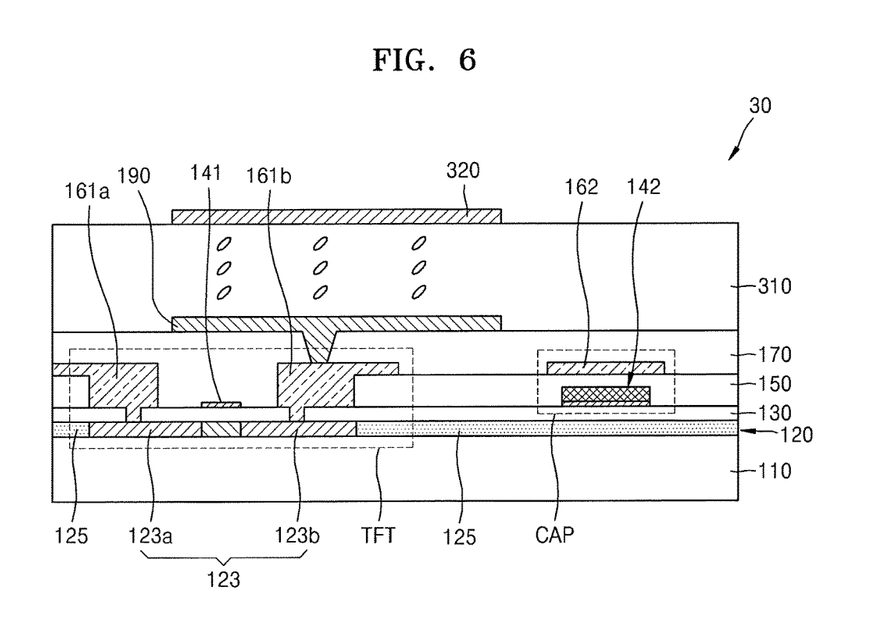

FIGS. 4 through 6 illustrate cross-sectional views of display apparatuses to which a TFT array substrate is applied, according to exemplary embodiments.

FIGS. 4 and 5 illustrate cross-sectional views of organic light-emitting display apparatuses 10 and 20 according to exemplary embodiments. In FIGS. 1, 4 and 5, like reference numerals denote like elements, and overlapping details are not provided. Referring to FIGS. 4 and 5, the organic light-emitting display apparatuses 10 and 20 may include, on the TFT array substrate 100, an organic light-emitting device (OLED) including a pixel electrode 190, an intermediate layer 210 including an organic emission layer, and a counter electrode 220. The organic light-emitting display apparatuses 10 and 20 may further include the pixel-defining film 180.

The pixel electrode 190 may be formed on the planarization film 170. The pixel electrode 190 may be electrically connected to the drain electrode 161b while filling the first opening 170a of the planarization film 170. The pixel electrode 190 may be a transparent electrode or a reflective electrode. When the pixel electrode 190 is a transparent electrode, the pixel electrode 190 may include ITO, IZO, ZnO, or $In_2O_3$. When the pixel electrode 190 is a reflective electrode, the pixel electrode 190 may include a reflective film formed of silver (Ag), magnesium (Mg), Al, platinum (Pt), palladium (Pd), gold (Au), nickel (Ni), neodymium (Nd), iridium (Ir), chromium (Cr), or a compound thereof, and a transparent film formed of ITO, IZO, ZnO, or $In_2O_3$. In some embodiments, the pixel electrode 190 may have a ITO/Ag/ITO structure.

The pixel-defining film 180 may define a pixel region and a non-pixel region. The pixel-defining film 180 may include an opening 180a in the pixel region, and may be formed to entirely cover the TFT array substrates 100 and 200. The intermediate layer 210 described later may be formed in the opening 180a, and the opening 180a may be the pixel region.

The pixel electrode 190, the intermediate layer 210, and the counter electrode 220 may form the OLED. Holes and electrons injected from the pixel electrode 190 and the counter electrode 220 of the OLED may combine in the organic emission layer of the intermediate layer 210 to emit light.

The intermediate layer 210 may include the organic emission layer. In an embodiment, the intermediate layer 210 may include the organic emission layer, and further include at least one of a hole injection layer (HIL), a hole transport layer (HTL), an electron transport layer (ETL), and an electron injection layer (EIL). In an embodiment, the intermediate layer 210 may include the organic emission layer and further include other various functional layers.

The counter electrode 220 may be formed on the intermediate layer 210. The counter electrode 220 may form an electric field with the pixel electrode 190, and light may be emitted from the intermediate layer 210. The pixel electrode 190 may be patterned according to pixels, and the counter electrode 220 may be formed such that a common voltage is applied to all pixels.

The pixel electrode 190 and the counter electrode 220 may each be a transparent electrode or a reflective electrode. The pixel electrode 190 may operate as an anode and the counter electrode 220 may operate as a cathode, or vice versa.

In FIGS. 4 and 5, only one OLED is shown, but a display panel may include a plurality of OLEDs. One pixel may be formed per OLED, and each pixel may realize red, green, blue, or white color.

In an embodiment, the intermediate layer 210 may be commonly formed throughout the pixel electrode 190 regardless of a location of a pixel. The organic emission layer may be formed as, for example, layers including emission materials emitting red, green, and blue lights vertically stacked on each other, or as emission materials mixed with each other. Other color may be combined as long as white light is emitted. The organic light-emitting display apparatuses 10 and 20 may further include a color converting layer or a color filter to convert emitted white light to a certain color.

A passivation layer (not shown) may be disposed on the counter electrode 220, and may cover and protect the OLED. The passivation layer may be an inorganic insulating film and/or an organic insulating film.

The organic light-emitting display apparatus 20 of FIG. 5 may include a pad electrode 203. The pad electrode 203 may be electrically connected to a driver IC (not shown) that supplies a current for driving the TFT, and the pad electrode 203 may receive and transmit the current from the driver IC to the TFT. The pad electrode 203 may be electrically connected to the TFT.

The pad electrode 203 may be disposed on the interlayer insulating film 150. The pad electrode 203 may include a first pad electrode layer 163' and a second pad electrode layer 193. The first pad electrode layer 163' may be formed of the same material and via the same process as the source or drain electrode 161a or 161b of the TFT. The first pad electrode layer 163' may include Al, Mo, Ti, or Cu. In some embodiments, the first pad electrode layer 163' may have a stacked structure of Ti/Cu, Mo/Al/Mo, or Ti/Al/Ti. The second pad electrode layer 193 may be formed of the same material and via the same process as the pixel electrode 190. The second pad electrode layer 193 may include ITO, IZO, ZnO, $In_2O_3$, Ag, Mg, Al, Pt, Pd, Au, Ni, Nd, Ir, or Cr.

The planarization film 170 and the pixel-defining film 180 may have an opening exposing the pad electrode 203, and the pad electrode 163 may be externally exposed.

FIG. 6 illustrates a cross-sectional view of a liquid crystal display apparatus 30 to which the TFT array substrate 100 is applied, according to an exemplary embodiment. In FIGS. 1 and 6, like reference numerals denote like elements, and overlapping details are not provided.

The liquid crystal display apparatus 30 of FIG. 6 may include the pixel electrode 190, an intermediate layer 310 including liquid crystal, a counter electrode 320, and a color filter layer (not shown) on the TFT array substrate 100 of FIG. 1.

The pixel electrode 190 may be formed on the planarization film 170. The pixel electrode 190 may be electrically connected to the drain electrode 161b while filling the opening 170a of the planarization film 170. The pixel electrode 190 may be a transparent electrode or a reflective electrode. When the pixel electrode 190 is a transparent electrode, the pixel electrode 190 may include ITO, IZO, ZnO, or $In_2O_3$. When the pixel electrode 190 is a reflective electrode, the pixel electrode 190 may include a reflective film formed of Ag, Mg, Al, Pt, Pd, Au, Ni, Nd, Ir, Cr, or a compound thereof, and a transparent film formed of ITO, IZO, ZnO, or $In_2O_3$. In some embodiments, the pixel electrode 190 may have a ITO/Ag/ITO structure.

The intermediate layer 310 may include the liquid crystal. An arrangement of the liquid crystal of the intermediate layer 310 may change according to an electric field formed by the pixel electrode 190 and the counter electrode 320. Transmittance of light passing through the intermediate layer 310 may be determined based on the arrangement of the liquid crystal in the intermediate layer 310.

The counter electrode 320 may be formed on the intermediate layer 310. The counter electrode 320 may be formed such that a common voltage is applied to all pixels. The counter electrode 320 may have any one of various shapes, for example, may include a plurality of slits.

The color filter layer may be further disposed on the counter electrode 320. The color filter layer may include a red, green, or blue filter based on a pixel. The color filter layer may assign a color to light that is irradiated from a backlight unit (not shown) below the TFT array substrate 100 and passed through the intermediate layer 310.

In FIG. 6, only one pixel is shown, but a display panel may include a plurality of pixels.

As described above, the TFT array substrate 100 according to an exemplary embodiment may be applied to the organic light-emitting display apparatus 10 or 20, or the liquid crystal display apparatus 30. In an embodiment, the TFT array substrate 100 may be applied to any one of various display apparatuses, such as a plasma display apparatus and an electrophoretic display apparatus.

By way of summation and review, a substrate on which the flat panel display apparatus is manufactured may include minute patterns of the TFT, the capacitor, and the wire, and the minute patterns may be formed using a photolithography process for transferring a pattern using a mask.

According to the photolithography process, photoresist may be uniformly coated on a substrate on which a pattern is to be formed, the photoresist may be exposed to light using an exposure device, such as a stepper, and then the photoresist may be developed. After the photoresist is developed, a pattern on the substrate may be etched using remaining photoresist, and then unnecessary photoresist may be removed after the pattern is formed.

When the pattern is transferred using the mask as such, a mask having a desired pattern needs to be prepared first, and if a number of processes using masks increases, manufacturing costs for preparing the masks increase.

One or more exemplary embodiments include a thin-film transistor (TFT) array substrate, a method of manufacturing the same, and a display apparatus employing the TFT array substrate, wherein a number of patterning processes using masks may be reduced. As described above, according to one or more exemplary embodiments, a patterning mask process and a channel doping mask process of a semiconductor layer may not be performed, a number of masks may be reduced, and manufacturing costs may be reduced and manufacturing processes may be simplified.

Example embodiments have been disclosed herein, and although specific terms are employed, they are used and are to be interpreted in a generic and descriptive sense only and not for purpose of limitation. In some instances, as would be apparent to one of skill in the art as of the filing of the present application, features, characteristics, and/or elements described in connection with a particular embodiment may be used singly or in combination with features, characteristics, and/or elements described in connection with other embodiments unless otherwise specifically indicated. Accordingly, it will be understood by those of skill in the art that various changes in form and details may be made without departing from the spirit and scope of the present invention as set forth in the following claims.

What is claimed is:

1. A thin-film transistor (TFT) array substrate including at least one TFT, the at least one TFT comprising:
   a semiconductor layer including a source region and a drain region having a first doping concentration on a substrate, a channel region between the source and drain regions and having a second doping concentration, the second doping concentration being lower than the first doping concentration, and a non-doped region extending from the source and drain regions;
   a gate insulating layer on the semiconductor layer;
   a gate electrode on the gate insulating layer and at least partially overlapping the channel region;
   an interlayer insulating layer disposed above the non-doped region;
   a capacitor; and
   a source electrode and a drain electrode insulated from the gate electrode and electrically connected to the source region and the drain region, respectively, wherein
   the interlayer insulating layer includes an opening to correspond the channel region and the source and drain regions, wherein
   a side wall of the opening of the interlayer insulating layer is vertically aligned to side walls of the source and drain regions, wherein
   the second doping concentration of channel region is higher than a concentration of the non-doped region, wherein
   the capacitor includes:
      a lower electrode disposed on a same layer as the gate electrode; and
      an upper electrode insulated from the lower electrode and at least partially overlapping the lower electrode, wherein
   the upper electrode of the capacitor is on a same layer as the source or drain electrode, wherein
   the lower electrode of the capacitor includes a first electrode layer and a second electrode layer, wherein
   a thickness of the gate electrode is thinner than a thickness of the lower electrode of the capacitor, wherein
   no insulating layer is between the first electrode layer and the second electrode layer of the lower electrode of the capacitor, wherein
   the non-doped region of the semiconductor layer overlaps the lower electrode of the capacitor, and wherein
   the semiconductor layer is disposed between the substrate and the gate electrode.

2. The TFT array substrate as claimed in claim 1, wherein the lower electrode of the capacitor is on the semiconductor layer where the non-doped region.

3. The TFT array substrate as claimed in claim 2, wherein the first electrode layer is formed of a same material as the gate electrode.

4. The TFT array substrate as claimed in claim 3, wherein:
   a thickness of the first electrode layer is thinner than a thickness of the second electrode layer, and
   a thickness of the gate electrode is the same as the thickness of the first electrode layer.

5. The TFT array substrate as claimed in claim 2, wherein the upper electrode includes a same material as the source or drain electrode.

6. The TFT array substrate as claimed in claim 1, wherein the gate electrode includes a transparent conductive material.

7. The TFT array substrate as claimed in claim 1, wherein a thickness of the gate electrode is from about 300 Å to about 500 Å.

8. The TFT array substrate as claimed in claim 1, further including a planarization film that covers the TFT and includes an opening partially exposing the source or drain electrode.

9. The TFT array substrate as claimed in claim 1, further including a pad electrode that includes a same material as the source and drain electrodes and is electrically connected to the TFT to transmit a current to the TFT.

10. A display apparatus, comprising:
    the thin-film transistor (TFT) array substrate as claimed in claim 1;

a pixel electrode electrically connected to the source and drain electrodes; and
a counter electrode facing the pixel electrode,
wherein an intermediate layer is between the pixel electrode and the counter electrode, and includes an organic emission layer or a liquid crystal layer.

11. A method of manufacturing a thin-film transistor (TFT) array substrate, the method comprising:
forming a non-doped semiconductor layer on an entire surface of a substrate;
forming a gate insulating layer on the non-doped semiconductor layer;
forming a preliminary-gate electrode of a TFT and a lower electrode of a capacitor on the gate insulating layer;
forming an interlayer insulating layer covering the lower electrode and having an opening exposing portions of the non-doped semiconductor layer that are to become a channel region and a source-drain region of the TFT, the source-drain region including source and drain regions;
performing a first doping process that forms the source-drain region in the exposed portions of the non-doped semiconductor layer such that a non-doped region that remains after performing the first doping process extends from each of the source and drain regions;
forming a source electrode and a drain electrode, which are connected to the source-drain region, and an upper electrode of the capacitor overlapping the lower electrode; and
performing a second doping process that forms the channel region on the non-doped semiconductor layer, wherein
a side wall of the opening of the interlayer insulating layer is vertically aligned to side walls of the source and drain regions, and wherein
a doping concentration of the channel region is higher than a concentration of the non-doped semiconductor layer, and wherein
the upper electrode of the capacitor is on a same layer as the source or drain electrode, wherein
the lower electrode of the capacitor includes a first electrode layer and a second electrode layer, wherein
a thickness of a gate electrode of the preliminary-gate electrode is thinner than a thickness of the lower electrode of the capacitor, wherein
no insulating layer is between the first electrode layer and the second electrode layer of the lower electrode of the capacitor, wherein
the non-doped region of the semiconductor layer overlaps the lower electrode, and wherein
the semiconductor layer is disposed between the substrate and the gate electrode.

12. The method as claimed in claim 11, wherein performing the first doping process includes injecting a dopant using the preliminary-gate electrode and the interlayer insulating layer as masks.

13. The method as claimed in claim 11, wherein the preliminary-gate electrode includes an upper gate electrode on the gate electrode,
the method further comprises, before performing the second doping process, removing the upper gate electrode, and
the second doping process includes injecting a dopant using the source electrode and the drain electrode as masks.

14. The method as claimed in claim 13, wherein the dopant injected during the second doping process is doped on the non-doped semiconductor layer through the gate electrode.

15. The method as claimed in claim 13, wherein:
the upper gate electrode includes a same material as the source electrode and the drain electrode, and
removing the upper gate electrode is performed simultaneously with forming the source electrode and the drain electrode.

16. The method as claimed in claim 13, wherein:
the gate electrode includes a transparent conductive material, and
a thickness of the gate electrode is from about 300 Å to about 500 Å.

17. The method as claimed in claim 11, wherein a doping concentration of the source-drain region is higher than a doping concentration of the channel region.

18. The method as claimed in claim 11, wherein:
the gate insulating layer includes a contact hole exposing a part of the source-drain region, and
the contact hole is formed simultaneously with the opening of the interlayer insulating layer during a halftone mask process.

19. The method as claimed in claim 11, further comprising forming a planarization film that covers the source electrode, the drain electrode, and the upper electrode, and includes an opening exposing a part of the source or drain electrode.

* * * * *